United States Patent [19]

Brennan

[11] Patent Number: 4,839,706
[45] Date of Patent: Jun. 13, 1989

[54] AVALANCHE PHOTODETECTOR

[75] Inventor: Kevin F. Brennan, Atlanta, Ga.

[73] Assignee: Polaroid Corporation, Cambridge, Mass.

[21] Appl. No.: 894,004

[22] Filed: Aug. 7, 1986

[51] Int. Cl.[4] ...................... H01L 27/14; H01L 29/90
[52] U.S. Cl. ......................................... 357/30; 357/4; 357/13; 357/58
[58] Field of Search ..................... 357/30 A, 30 E, 13, 357/4 SL, 58

[56] References Cited

U.S. PATENT DOCUMENTS

| 4,353,081 | 10/1982 | Allyn et al. | 357/16 |
| 4,383,269 | 5/1983 | Capasso | 357/30 |
| 4,390,889 | 6/1983 | Capasso et al. | 357/30 |
| 4,471,155 | 9/1984 | Mohr et al. | 357/58 |
| 4,476,477 | 10/1984 | Capasso et al. | 357/30 |
| 4,486,765 | 12/1984 | Capasso | 357/13 |
| 4,553,155 | 11/1985 | Chen et al. | 357/30 |

OTHER PUBLICATIONS

"Current Fluctuations in a Semiconductor (Dielectric) Under the Conditions of Impact Ionization and Avalanche Breakdown," by A. S. Tager, in Sov. Phy.—Solid State, vol. 6, No. 8, Feb., 1965, pp. 1919–1925.
"Multiplication Noise in Uniform Avalanche Diodes," by R. J. McIntyre, IEEE Trans. Electron Dev., vol. ED-13, No. 1, Jan., 1966, pp. 164–168.
"Impact Ionization in Multilayered Heterojunction Structures," by R. Chin, N. Holonyak, G. E. Stillman, J. Y. Tang, and K. Hess, Electronics Letters, vol. 16, No. 12, Jun. 5, 1980, pp. 467–469.
"The Channeling Avalanche Photodiode: A Novel Ultra-Low-Noise Interdigitated p-n Junction Detector," by F. Capasso, IEEE Trans. Electron Dev., vol. ED-29, No. 9, Sep. 1982, pp. 1388–1395.
"Staircase Solid-State Photomultipliers and Avalanche Photodiodes with Enhanced Ionization Rates Ratio," by F. Capasso, W. T. Tsang and G. F. Williams, IEEE Trans. Electron Dev., vol. ED-30, No. 4, Apr., 1983, pp. 381–390.
"Single-Carrier-Type Dominated Impact Ionization in Multilayer Structures," by H. Blauvelt, S. Margalit, and A. Yariv, Electronics Letters, vol. 18, No. 9, Apr. 29, 1982, pp. 375–376.
"Problems Relates to p-n Junctions in Silicon," by W. Shockley, Solid-State Electron., vol. 2, No. 1, 1961, pp. 35–67.
"Band Structures and Pseudopotential Form Factors for Fourteen Semiconductors of the Diamond and Zinc-Blende Structures," by M. L. Cohen and T. K. Bergstresser, Phys. Rev., vol. 141, No. 2, Jan., 1966, pp. 789–796.
"Concerning the Theory of Impact Ionization in Semiconductors," by L. V. Keldysh, Zh. Eksp. Teor. Fiz., 1965, vol. 48, pp. 1692–1707, Soviet Physics JETP, vol. 21, No. 6, Dec., 1965, pp. 1135–1144.
"Experimental Determination of Impact Ionization Coefficients in (100) GaAs," by G. E. Bulman, V. M. Robbins, K. F. Brennan, K. Hess, and G. E. Stillman, IEEE Elec. Dev. Letters, vol. EDL-4, No. 6, Jun., 1983, pp. 181–185.
"Energy-Gap Discontinuities and Effective Masses for GaAs-$Al_xGa_{1-x}$As Quantum Wells," by R. C. Miller, D. A. Kleinman, and A. C. Gossard, Phys. Rev. B, vol. 29, No. 12, Jun. 15, 1984, pp. 7085–7087.

(List continued on next page.)

Primary Examiner—William L. Sikes
Assistant Examiner—Georgia Y. Epps
Attorney, Agent, or Firm—Edward S. Roman; Michael B. Einschlag

[57] ABSTRACT

A low noise doped quantum well avalanche photodector (APD) having repeated superlattice units. Where the majority carriers are electrons, each unit is formed from $p^+$-$n^+$ layers of a first material having a first ionization threshold, a near intrinsic layer of a second material having a smaller ionization threshold, and a near intrinsic layer of the first material. Such an APD can be fabricated in the GaAs/AlGaAs material system.

19 Claims, 3 Drawing Sheets

OTHER PUBLICATIONS

"Parabolic Quantum Wells with the GaAs–$Al_x$ $Ga_{1-x}As$ System," by R. C. Miller, A. C. Gossard, D. A. Kleinman, and O. Munteanu, *Phys. Rev. B.*, vol. 29, No. 6, Mar. 15, 1984, pp. 3740–3743.

"Confined Carrier Quantum States in Ultrathin Semiconductor Heterostructures," by R. Dingle, *Festkorperprobleme*, H. J. Queisser, ed., *Advances in Solid State Physics*, vol. 15, Pergamon/Vieweg, Braunshweig, 1975, pp. 21–48.

"Tunable Barrier Heights and Band Discontinuities via Doping Interface Dipoles: an Interface Engineering Technique and its Device Applications," by F. Capasso, K. Mohammed and A. Y. Cho., *J. Vac. Sci. Technology B*, vol. 3, No. 4, Jul./Aug., 1985, pp. 1245–1251.

"Excess Noise Factors for Conventional APDs, Staircase APDs, and PMTs," by M. C. Teich, K. Matsuo, and B. E. A. Saleh, *IEEE J. Quantum Electron.*, vol. QE-22, No. 8, Aug., 1986, pp. 1184–1193.

"Time and Frequency Response of the Conventional Avalanche Photodiode," by M. C. Teich, K. Matsuo, and B. E. A. Saleh, *IEEE J. Quantum Electron.*, vol. ED-33, No. 10, Oct., 1986, pp. 1511–1517.

"III–V Compound Semiconductor Devices: Optical Detectors," by G. E. Stillman, V. M. Robbins, and N. Tabatabaie, *IEEE Trans. Electron Dev.*, vol. ED-31, No. 11, Nov., 1984, pp. 1543–1655.

"Avalanche Photodiodes," by G. E. Stillman and C. M. Wolfe, *Semiconductors and Semimetals* (R. K. Willardson and A. C. Beers, eds.), Academic Press, vol. 12, 1977, pp. 291–393.

"Electron and Hole Impact Ionization Coefficients in (100) and in (111) Si," by V. M. Robbins, T. Wang, K. F. Brennan, K. Hess, and G. E. Stillman, *J. Appl. Phys.*, vol. 58, No. 12, Dec. 15, 1985, pp. 4614–4617.

"Electron and Hole Ionization Rates in Epitaxial Silicon at High Electric Fields," by W. N. Grant, *Solid-State Electron.*, vol. 16, 1973, pp. 1189–1203.

"Theory of Electron Impact Ionization Including a Potential Step: Application to GaAs–AlGaAs," by K. Brennan, T. Wang, and K. Hess, *IEEE Electron. Dev. Lett.*, vol. EDL-6, No. 4, Apr., 1985, pp. 199–201.

"Enhancement of Electron Impact Ionization in a Superlattice: a New Avalanche Photodiode with a Large Ionization Rate Ratio," by F. Capasso, W. T. Tsang, A. L. Hutchinson, and G. F. Williams, *Appl. Phys. Lett.*, vol. 40, No. 1, Jan. 1, 1982, pp. 38–40.

"Performance Characteristics of High-Quality GaAs/$Al_xGa_{1-x}As$ Superlattice Avalanche Photodiodes," by F-Y. Juang, Y. Nashimoto, P. K. Bhattacharya, and S. Dhar, presented at the 43rd Annual Device Research Conference, Boulder Co., Jun. 1985.

"Band-Structure-Dependent Transport and Impact Ionization in GaAs," by H. Shichijo and K. Hess, *Phys. Rev. B.*, vol. 23, No. 8, Apr. 15, 1981, pp. 4197–4207.

"Lucky-Drift Mechanism for Impact Ionization in Semiconductors," by B. K. Ridley, *J. Phys. C.: Solid State Phys.*, vol. 16, 1983, pp. 3373–3388.

"Factors Affecting Impact Ionization in Multilayer Avalanche Photodiodes," *IEEE Proceedings*, vol. 132, Pt. J., No. 3, Jun., 1985, pp. 177–183.

"Noise Properties and Time Response of the Staircase Avalanche Photodiode," by K. Matsuo, M. C. Teich, and B. E. A. Saleh, *IEEE Trans. Electron Dev.*, vol. ED-32, No. 12, Dec., 1985, pp. 2615–2623.

"Band Structure of GaAs, GaP, InP, and AlSb: the k*p Method," Proceedings of the International Conference on the Physics of Semiconductors, Kyoto, 1966, *J. of the Phys. Soc. of Japan*, vol. 21, Supplement, 1966, pp. 20–26.

"Alloy Scattering in Ternary III-IV Compounds," by J. W. Harrison and J. R. Hauser, *Phys. Rev. B.*, vol. 13, No. 12, Jun. 15, 1976, pp. 5347–5350.

"Theoretical Calculations of Elecetron Mobility in Ternary III-IV Compounds," by J. W. Harrison and J. R. Hauser, *J. Appl. Phys.*, vol. 47, No. 1, Jan., 1976, pp. 292–300.

"Theory of High-Field Transport of Holes in GaAs and InP," by K. Brennan and K. Hess, *Phys. Rev. B.*, vol. 29, No. 10, May 15, 1984, pp. 5581–5590.

"Impact Ionization of Electrons in Silicon (Steady State)," by J. Y. Tang and K. Hess, *J. Appl. Phys.*, vol. 54, No. 9, Sep., 1983, 5139–5144.

AVALANCHE PHOTODETECTOR

TECHNICAL FIELD OF THE INVENTION

The present invention relates to optical detectors and, in particular, to an avalanche photodetector (APD).

BACKGROUND OF THE INVENTION

The signal-to-noise power ratio of a photodetector is proportional to:

$$1/[2q(i_p+i_b+i_d)(F_eB)+4kTB/(R_{eq}M^2)] \quad (1)$$

where q is the electronic charge, $i_p$ is the photocurrent, $i_b$ is the background current, $i_d$ is the dark current, $F_e$ is the excess noise factor, B is the bandwidth, k is Boltzmann's constant, T is the temperature, $R_{eq}$ is the equivalent resistance of the load, and M is the average multiplication rate or the gain. The signal-to-noise power ratio decreases as the contributions of the first and second terms in eqn (1) increase. However, the contribution of the first term is made smaller if the excess noise factor $F_e$ decreases and the contribution of the second term, representing thermal noise, is made smaller if the gain increases. Thus, in order to increase the signal-to-noise power ratio, it is desirable to use a photodetector having low noise and high gain.

A photomultiplier tube is one of the best devices for providing low noise performance at high gain. In the photomultiplier, carrier multiplication occurs via secondary emission of electrons from metallic grids or dynodes sequentially spaced throughout the tube. The electrons can be accelerated in the vacuum to energies well above the ionization threshold while in transit between dynodes, and as a result, the gain per dynode is not limited to 2 per dynode as it is in semiconductor devices. In fact, gains between 5 and 10 per dynode are common, and overall gains can be several orders of magnitude higher than in semiconductor devices. Nevertheless, in many applications, photomultiplier have limited applicability because of their size, the high voltages required for efficient operation and the need to maintain a vacuum. Thus, there is a need for a low noise, high gain semiconductor photodetector.

Noise in any electronic device arises from fluctuations in the carrier arrival rate at the collecting contact. If no statistical fluctuations in the carrier velocities from the ensemble average velocity occur, then the carrier arrival rate, and hence the current, is completely deterministic and no noise is produced thereby. Thus, the noise of a system can be assessed by determining the variance, i.e. the average deviation from the mean, of the current.

In a p-n junction device, noise arises from the spontaneous emission and subsequent collection of independent charge carriers. An article entitled "Current Fluctuations In A Semiconductor (Dielectric) Under The Conditions Of Impact Ionization and Avalanche Breakdown," by A. S. Tager, in *Sov. Phy.—Solid State*, Vol. 6, pp. 1919–1925, 1965 discloses that this noise, commonly referred to as shot noise, is given by:

$$<i_s^2> = 2qB<I> \quad (2)$$

where $<I>$ is the mean collected current and B is the bandwidth.

In an avalanche photodiode, APD, additional noise arises from the fluctuation in the carrier generation rate since, in general, the carrier generation rate is not fully deterministic. In addition, fluctuations in the photon arrival rate add to the randomness in the collected current.

Tager, and later McIntyre, in an article entitled "Multiplication Noise In Uniform Avalanche Diodes," by R. J. McIntyre, *IEEE Trans. Electron Dev.*, Vol. ED-13, 1966, pp. 164–168, demonstrated that randomness in the multiplication process produces the greatest noise when the electron and hole ionization rates are equal.

For wavelengths on the order of 1.06 um, low noise APDs can be made from silicon because the ratio of electron and hole ionization rates is large, being at least as large as 20. However, APDs which are sensitive over a large range of wavelengths are necessarily made from many different material systems, in particular from III-V semiconductor compounds and their related alloys. Unfortunately, the bulk ionization rates for electrons and holes are roughly equal in most of these materials. As a consequence, low noise, high gain photodetectors for use at long wavelengths include particular structural means for increasing the ratio of the electron and hole ionization rates over that occurring in the bulk materials from which the photodetectors are fabricated.

The following refers to semiconductor photodetectors in the prior art:

(1) An article entitled "Impact Ionization In Multilayered Heterojunction Structures," by R. Chin, N. Holonyak, G. E. Stillman, J. Y. Tang, and K. Hess, *Electronics Letters*, Vol. 16, 1980, pp. 467–469 discloses the use of a superlattice structure consisting of alternating thin layers of GaAs and $Al_xGa_{1-x}As$ in an attempt to increase the ratio of electron and hole ionization rates in a quantum well APD. It is suggested that the electron distribution is heated more than the hole distribution because of the relatively large energy difference between the conduction and valence band edge discontinuities in the specified materials and because of the difference between the electron and hole ionization mean free paths. Nevertheless, my analysis shows that because (1) the superlattice is equivalent to a spatially periodic electric field, (2) there is a strong nonlinear, i.e. exponential, dependence of "a" and "b" on the electric field, and (3) there is a threshold energy in the impact ionization process, both the electron and hole ionization rates in the superlattice are enhanced above their respective values in the bulk materials. However, the enhancement of the hole ionization rate is much less than that of the electron ionization rate for two reasons. First, because the conduction band edge discontinuity in the disclosed material system is significantly larger than the valence band edge discontinuity, electrons obtain a larger kinetic energy boost from the heterointerface between the GaAs and $Al_xGa_{1-x}As$ layers than do the holes. Second, and more important because the hole energy relaxation rate is much larger than the electron relaxation rate for the average carrier energies involved in the APD, the holes relax faster to their steady state energy after crossing the heterointerface than do the electrons. This results in fewer holes that "lucky-drift" to energies high enough to cause impact ionization.

(2) An article entitled "The Channeling Avalanche Photodiode: A Novel Ultra-Low-Noise Interdigitated p-n Junction Detector," by F. Capasso, *IEEE Trans. Electron Dev.*, Vol. ED-29, 1982, pp. 1388–1395 discloses the use of a superlattice structure consisting of alternating n-GaAs and p-Al$_{0.45}$Ga$_{0.55}$As layers in another attempt to increase the ratio of electron and hole ionization rates in a channeling APD. The channeling APD is configured so that a reverse bias produces both transverse and longitudinal electric field components therein. The transverse field sweeps holes out of the GaAs layers and into adjacent Al$_{0.45}$Ga$_{0.55}$As layers while confining the electrons within the GaAs layers.

(3) An article entitled "Staircase Solid State Photomultipliers And Avalanche Photodiodes With Enhanced Ionization Rate Ratio," by F. Capasso, W. T. Tsang and G. F. Williams, *IEEE Trans. Electron Dev.,* Vol, ED-30, 1983, pp. 381–390 discloses the use of a superlattice structure whose layers have a graded energy band gap in yet another attempt to increase the ratio of electron and hole ionization rates in a graded gap staircase APD. In such an APD, impact ionization events occur at specific and localized areas within the device, whereas, in a channeling APD impact ionization events occur randomly throughout a layer. Because impact ionization is localized in a graded gap staircase APD, the variability and, hence, the gain fluctuation of the number of electrons generated per photon is reduced. Thus, the excess noise in the graded gap staircase APD is lower than that in a conventional uniform APD and in a channeling APD. Nevertheless, a graded gap staircase APD fabricated from a GaAs/AlGaAs material system does not achieve optimum ionization localization because the conduction band edge offset between GaAs and AlGaAs is not a sufficiently large fraction of the energy bandgap in GaAs.

(4) An article entitled "Single-Carrier-Type Dominated Impact Ionization In Multilayer Structures," by H. Blauvelt, S. Margalit, and A. Yariv, *Electronics Letters,* Vol. 18, 1982, pp. 375–376, referred to hereinafter as Blauvelt et al discloses the use of a doped superlattice structure consisting of p+-i-n+ AlGaAs layers followed by near intrinsic GaAs and AlGaAs layers in yet another attempt to increase the ratio of electron and hole ionization rates in a quantum well APD. This structure is designed to spatially restrict the regions wherein impact ionization occurs in order to minimize the variability of the number of electrons generated per detected photon. This quantum well APD more nearly approximates photomultiplier-like behavior in regard to the localization of carrier multiplication than either the channeling APD or the graded gap staircase APD.

Blauvelt et al, however, used an unrealistically simple model of impact ionization disclosed in an article entitled "Problems Related To P-N Junctions In Silicon," by W. Shockley, *Solid State Electron.,* Vol. 2, 1961, pp. 35–67, to analyze "a"/"b" for their APD. As a result, they recognized that the selected model, along with their qualitative design features, were inadequate tools for optimizing the design of a practical APD. Blauvelt et al stated that optimized design of the detector would necessitate calculation of the electron and hole distributions at each position as the carriers moved through the layers of the detector. Furthermore, Blauvelt et al, did not consider P the probability that an electron impact ionizes at the output of each unit of a multi-unit APD, and Q, the probability that a hole impact ionizes at the output of each unit of a multi-unit APD, in discussing the APD notwithstanding the fact that these are crucial factors to consider in providing an appropriate design for a practical APD. As a result of not considering P and Q, in addition to using a simplified model to analyze their device, Blauvelt et al completely mischaracterized the optimal, or even the appropriate parameters for a practical doped quantum well APD.

In summary, the manner in which the above-discussed devices differ is essentially the following. In the conventional APD, impact ionizations are not spatially controlled, i.e. there is no structure analogous to the dynodes of a photomultiplier. In addition, the impact ionization of secondary carriers is not suppressed, and as a result, the degree to which the secondary carriers contribute to the gain and the noise is determined solely by the material properties of the materials from which the device is fabricated. Consequently, in the conventional APD structure, GaAs is at a serious disadvantage with respect to silicon due to the nearly equal electron and hole ionization rates in GaAs. For silicon, the holes are found to have smaller impact ionization rates by a factor estimated to be about 20.

Staircase APDs, and related devices, have periodic structures which act to confine the impact ionization process to designated points in the device, so that the number of multiplications and the multiplication factor can be brought more under control, thereby reducing the output noise. In addition, the periodic structures suppress multiplication by secondary carriers and thereby improve noise performance.

In light of the above, a need exists for a low noise, high gain APD.

SUMMARY OF THE INVENTION

The present invention is directed to a low noise, high gain APD embodied in a doped quantum well avalanche photodetector (APD) comprising repeated superlattice units formed from two materials. In an inventive APD where the majority carriers are electrons, each superlattice unit comprises p+-n+ layers of a first material having a first ionization threshold, a near intrinsic layer of a second material having a second, smaller ionization threshold, and a near intrinsic layer of the first material. Since ionization thresholds of semiconductors are generally proportional to the band gap, any two semiconductors with different band gaps could be used.

According to the present invention, a preferred embodiment of a low noise APD is obtained in various material systems when specific ranges of design parameters for the APD are chosen. The ranges are chosen in accordance with a many-particle, ensemble Monte Carlo model which includes the full details of the band structure of the two materials in the superlattice unit. In addition, the model takes into account the various carrier scattering mechanisms which occur in the two materials.

A preferred embodiment of a low noise, high gain doped quantum well APD fabricated in accordance with the present invention for the GaAs/AlGaAs material system has the following values for various design parameters:

(1) Doping Levels of the p+ and n+ AlGaAs Layers:

The doping level should be greater than $2.0 \times 10^{18}$ cm$^{-3}$.

(2) AlGaAs Layer Widths in the p+-n+ region—the p+ *and the* n+ layers should be as small as possible consistent with enclosing an adequate amount of charge:

The p+ and the n+ layers should each be in the approximate range between 90 and 300 angstroms.

(3) GaAs Layer Width—too small GaAs layer widths result in quantum mechanical spatial quantization effects which are deleterious to device performance:

The GaAs layer width should be in the approximate range between 180 and 300 angstroms.

(4) near intrinsic AlGaAs Layer Width—it is important to have a region which is sufficiently long that holes can cool after drifting through the high field $p^+$-$n^+$ region:

The near intrinsic AlGaAs layer width should be in the approximate range between 200 and 500 angstroms.

(5) Percentage of Al in the Ternary AlGaAs Composition—it is desirable to use direct band gap materials since no appropriate advantage can be obtained from the use of an indirect band gap material. This is because the effective band gap no longer increases with increasing Al mole fraction (x) when the material becomes an indirect band gap material and because greater electron momentum would be required to cause impact ionization in the indirect band gap material. Thus, it is desirable to use direct band gap materials and to obtain the largest change in the conduction band between GaAs and AlGaAs:

Mole fraction x should be in the approximate range between 0.4 to 0.45, or which is approximately at the transition between the direct and indirect materials.

(6) Applied Electric Field:

The electric field should be in the approximate range between 100 and 200 kV/cm.

These parameters were chosen in accordance with the "Brennan Analysis" which is defined as a Monte Carlo ensemble model analysis of the Boltzmann transport equation which includes the full details of the band structure of the two materials in the superlattice unit and the physical scattering mechanisms under the constraints that Q, the probability that a secondary carrier impact ionizes at the output of each unit, be as close to 0 as possible, that the gain of the APD formed from the units be below avalanche breakdown, and secondarily that P, the probability that an incident carrier impact ionizes at the output of each unit, be as large as possible consistent with a small value of Q.

Similarly, by using the "Brennan Analysis," design parameters of preferred embodiments for other material systems such as AlInAs/GaInAs may be provided.

BRIEF DESCRIPTION OF THE DRAWING

A complete understanding of the present invention may be gained by considering the following detailed description in conjunction with the accompanying drawing, in which.

To facilitate understanding, identical reference numerals are used to designate elements common to the figures.

DETAILED DESCRIPTION

Figure 1:
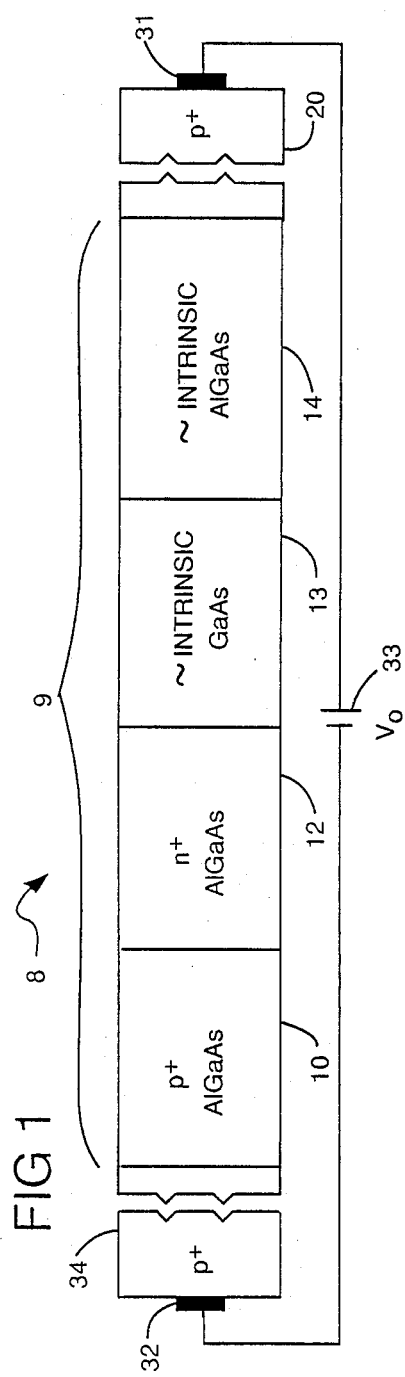
FIG. 1 shows, in pictorial form, a doped quantum well APD and a unit cell thereof fabricated in accordance with the present invention.
Figure 2:
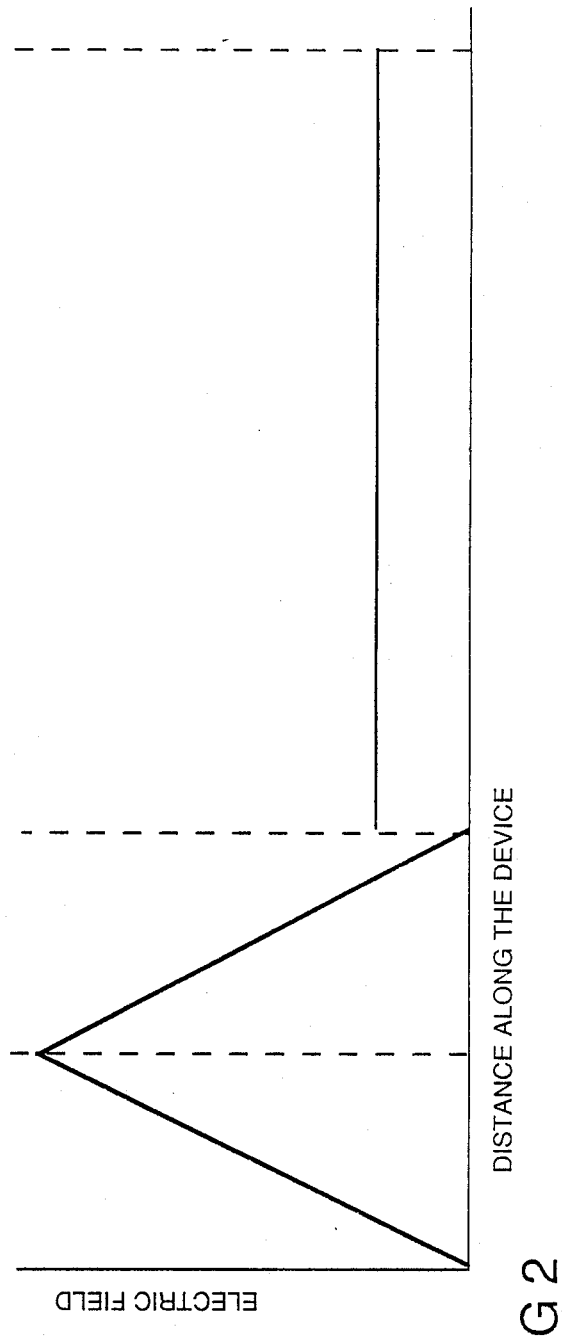
FIG. 2 shows, in graphical form, an electric field profile of the unit cell shown in FIG. 1.

FIG. 1 shows APD 8 fabricated in a GaAs/AlGaAs material system in accordance with the present invention and bias means comprising voltage source 33. APD 8 comprises electrodes 32 and 31 contacted to $p^+$ region 34 and $n^+$ region 20, respectively, and a repeating superlattice unit 9. Each superlattice unit 9 comprises $p^+$ AlGaAs layer 10, $n^+$ AlGaAs layer 12, near intrinsic GaAs layer 13, and near intrinsic AlGaAs layer 14, where each AlGaAs layer is the alloy $Al_{0.45}Ga_{0.55}As$. Voltage $V_0$ from voltage source 33 is applied to electrodes 31 and 32 to reverse-bias the device. By doping the layers as described, i.e. $p^+$-$n^+$ $Al_{0.45}Ga_{0.55}As$ layers 10 and 12 followed by near intrinsic GaAs and $Al_{0.45}Ga_{0.55}As$ layers 13 and 14, the electric field profile in the superlattice unit comprising layers 10–14 is asymmetric. This electric field profile is shown in FIG. 2.

When the APD is reverse biased, electrons are accelerated in the high electric field region of layers 10 and 12 before being injected into GaAs layer 13 where avalanche multiplication occurs. In contrast, holes are accelerated in the low electric field region of layer 14 before being injected into GaAs layer 13. As a result, electrons are accelerated by a much greater field than holes before arriving at GaAs layer 13. Thus, the combined action of being accelerated in a high electric field and subsequently being injected over the heterointerface between AlGaAs layer 12 and GaAs layer 13 produces very hot electrons within narrow bandgap GaAs layer 13. The electrons are sufficiently hot that substantial impact ionization occurs. Conversely, the holes undergo little heating within low field intrinsic $Al_{0.45}Ga_{0.55}As$ layer 14 before being injected into narrow bandgap GaAs layer 13 and few, if any, impact ionization events occur. The holes do, of course, also drift in the high field $p^+$-$n^+$ AlGaAs layers 10 and 12. However, after that, they enter low field intrinsic AlGaAs layer 14 where the bandgap is much larger than in GaAs layer 13, and in which layer they lose energy before being injected into the narrow band gap GaAs layer. As a result, the hole ionization rate in the GaAs layer is low.

Layer thicknesses and doping concentrations for preferred embodiments of the inventive APD are chosen in accordance with a many-particle, ensemble Monte Carlo model which includes the full details of the band structure of the two materials in the superlattice unit.

The principal equation governing transport phenomena in a solid is the Boltzmann Transport Equation. However, in a complicated system like a solid, the Boltzmann equation is exceedingly difficult to solve while at the same time retaining the essential physics of the process. Thus, its general solution requires a numerical approach such as the Monte Carlo method. The Monte Carlo method is particularly well adapted for high energy, high field transport. The full details of the GaAs conduction band structure, derived from an empirical pseudopotential calculation disclosed in an article entitled "Band Structures and Pseudopotential Form Factors for Fourteen Semiconductors of the Diamond and Zinc-Blende Structures," by M. L. Cohen and T. K. Bergstresser, *Phys Rev.*, Vol. 141, 1966, pp. 789–796, as well as the full details of both the GaAs and $Al_{0.45}Ga_{0.55}As$ valence band structures derived using a k*p calculation are included in the model. The full details of the AlGaAs conduction band structure were derived from the GaAs band structure by using a modified energy gap and ionization energy. Although the substitution of AlGaAs in place of GaAs may introduce some error because both Gamma and L are degenerate in $Al_{0.45}Ga_{0.55}As$ while they are separated by 0.30 eV in GaAs, it is expected that the band structures are reasonably similar at the high electron energies where impact ionization occurs. Nevertheless, inclusion of the full details of the AlGaAs valence band structure is crucial because optimal APD performance requires a low hole ionization rate.

Hole ionization within the high field AlGaAs region, as well as within the GaAs layer, must be avoided. This places constraints on the doping levels and layer widths used in the structure. For example, it has been discovered that significant hole ionization occurs within bulk $Al_{0.45}Ga_{0.55}As$ for applied electric fields at or above 300 kV/cm.

The following electron and hole spattering mechanisms are included in the model calculations: polar scattering, deformation potential, carrier-carrier, impact ionization, and alloy scattering within the AlGaAs. Impact ionization was treated as a scattering mechanism in accordance with an article entitled "Concerning the Theory of Impact Ionization in Semiconductors," by L. V. Keldysh, *Zh. Eksp. Teor. Fiz.*, 1965, Vol. 48, pp. 1692–1707, *Soviet Physics. —JETP*, 1965, Vol. 21, pp. 1135–1144. As a control for the calculations, both the bulk GaAs and AlGaAs electron and hole impact ionization rates were calculated and compared to existing data from an article entitled "Experimental Determination of Impact Ionization Coefficients in (100) GaAs," by G. E. Bulman, V. M. Robbins, K. F. Brennan, K. Hess, and G. E Stillman, *IEEE Elec. Dev. Letters*, Vol. EDL-4, 1983, pp. 181–185.

The Monte Carlo model is able to isolate the effect of APD geometry on the ionization rates, doping, layer widths, and so forth, because any difference between the calculated bulk and superlattice ionization rates must be due solely to the presence of the superlattice structure.

FIG. 2 shows the built-in field profile within p+-n+ layers 10 and 12 which is calculated from the one-dimensional Poisson equation. The term built-in field refers to the electric field which results from the doping within the p+-n+ region after the field resulting from the applied reverse bias voltage fully depleted this region. From Gauss' law, when the net charge in n+ layer 12 and p+ layer 10 is the same, the high field region is completely confined to p+-n+ layers 10 and 12. The reverse bias applied by voltage source 33 must be sufficiently large to fully deplete n+ layer 12 and p+ layer 10. After p+-n+ layers 10 and 12 are fully depleted, they act like an intrinsic layer in that additional reverse bias will only add a constant electric field perpendicular to the layers, which constant electric field acts to accelerate the carriers throughout the structure—the term applied field refers to the incremental electric field which results in the layers of the APD after the highly doped region is fully depleted. Thus, in the highly doped region the electric field is the sum of the built-in field and the applied field, whereas, in the intrinsic region, the electric field is just the applied field.

Upon encountering the GaAs/AlGaAs heterointerface—between layers 12 and 13 for electrons—and—between layers 13 and 14 for holes—the electrons and holes gain a kinetic energy boost equal to the conduction and valence band edge discontinuities, respectively. The band edge offsets are chosen in accordance with the 60/40 rule disclosed in an article entitled "Energy-Gap Discontinuities and Effective Masses for GaAs-AlGaAs Quantum Wells," by R. C. Miller, D. A. Kleinman, and A. C. Gossard, *Phys. Rev. B*, Vol. 29, 1984, pp. 7085–7087 and an article entitled "Parabolic Quantum Wells with the $GaAs-Al_xGa_{1-x}As$ System," *Phys. Rev. B*, Vol. 29, 1984, pp. 3740–3743.

For the $GaAs/Al_{0.45}Ga_{0.55}As$ material system the energy band gaps are 1.42 eV and 1.99 eV, respectively. Using the 60/40 rule, the conduction band energy difference at the heterointerface is 0.347 eV, whereas the valence band energy difference at the heterointerface is 0.213 eV. The large energy difference at the valence band in this material system shows why it is so important to cool the holes before they impinge upon the GaAs ionization layer.

For small GaAs well widths, i.e. widths of GaAs layer 13 that are less than 200 angstroms, spatial quantization effects become important. As is well known, spatial quantization introduces sub-bands within a quantum well that lie above the conduction band minimum, for example see an article entitled "Confined Carrier Quantum States in Ultrathin semiconductor Heterostructures," by R. Dingle, *Festkorperprobleme*, H. J. Queisser, ed., *Advances in Solid State Physics*, Vol. 15, Pergamon/Vieweg, Braunshweig, 1975, pp. 21–48. The carriers can thermalize no lower in energy than the first sub-band rather than at the conduction band minimum. The sub-bands are calculated from a solution of the Schrodinger Equation for a finite square well. Since the barrier region—the separation distance between adjacent wells, i.e., the distance between layer 13 in adjacent superlattice units—is very large, tunneling effects between wells were neglected. For simplicity, only the effect of the first sub-band was considered. Spatial quantization has two important effects on electron and hole transport in the APD which were included in the model. First, the effective barrier height is reduced when sub-bands are present, thus, carriers gain less energy from the heterointerface. Second, the effective threshold energy for impact ionization is larger than in the bulk since the effective bandgap is increased.

Figure 3:
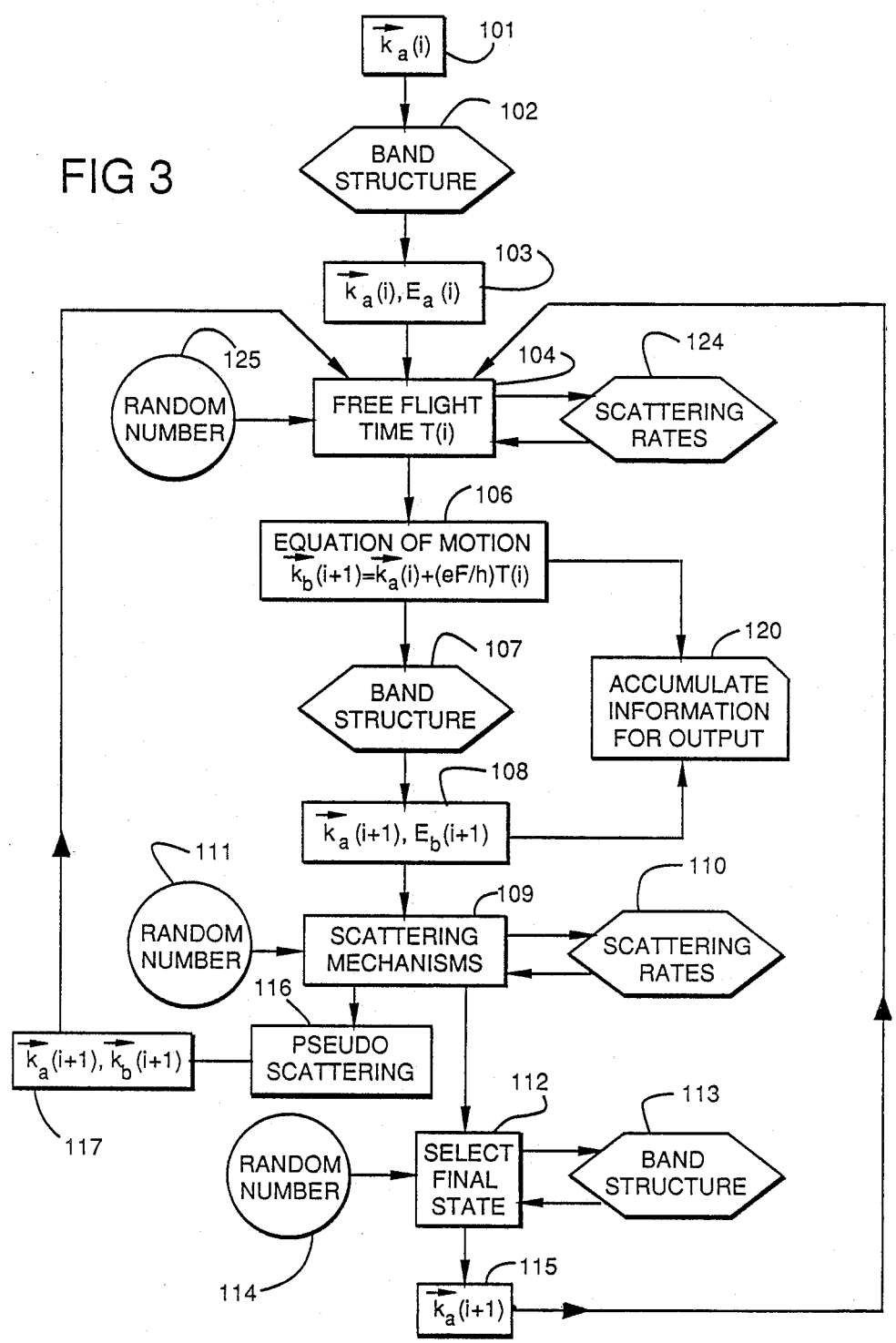
FIG. 3 shows, in pictorial form, a flow chart of the Monte Carlo analysis performed to determine preferred embodiments of the present invention.

FIG. 3 shows, in pictorial form, a flow chart of the Monte Carlo analysis which was performed to determine ranges of parameters for preferred embodiments of the present invention. An initial momentum and position is chosen at box 101. Since one is looking at a steady state solution, the method used to choose the initial state is irrelevant, for example in this case a Maxwell-Boltzmann distribution was used. However, if one were to compute a transient response for the APD, a more appropriate choice for an initial state might entail use of the Fermi-Dirac distribution.

The energy corresponding to the chosen momentum and position is then computed from the band structure at box 102 and shown at box 103. The detailed band structure is numerically used to provide an accurate conversion from momentum to energy. A free flight time T(i) is computed at box 104 by utilizing a random number, box 105, and a representative scattering rate determined from a composite of the scattering rates for all the competing physical scattering mechanisms, box 124. The free flight time T(i) is used to compute a new momentum in box 106 from the following semiclassical equation of motion:

$$k_f = k_i + (eF_{ext}/h)T(i) \qquad (3)$$

where $F_{ext}$ is the effective external force on a carrier including the electric field. The electric field includes the applied electric field and the built-in field due to the doping and is shown in FIG. 2.

The energy is computed from the band structure, as before, in boxes 107 and 108 and the results produced in boxes 106 and 108 are accumulated for output at box 120.

In box 109, a determination is made as to whether a carrier scatters by considering the scattering rates for the various scattering mechanisms from box 110 along with a random number from box 111. If the carrier does not scatter, it is assumed to continue to drift under the action of the electric field. In the flow chart this is indicated by branching to boxes 116 and 117 and then returning back to box 104. If the carrier is predicted to scatter at box 109, control transfers to box 112. There, the scattering mechanism is chosen stochastically by using a random number from box 114 and the comparative strength of the scattering process. Box 112 determines the final state momentum from the physics of the scattering mechanism itself along with the band structure input from box 113. The momentum of the scattered carrier is then transmitted to box 115 and the process continues at box 104 for iteration.

The Monte Carlo model then proceeds to accumulate average energy, velocity and impact ionization rate in box 120 until a steady state is achieved. Steady state, in the context of these calculations, occurs when the accumulators all average to constant values. For most of the calculations performed, many carriers, for example 1000–1500, are simulated simultaneously for up to 10 psec of travel time and yield excellent convergence to a steady state.

The results of the above-described procedure must be used in connection with other factors which are crucial in determining appropriate designs of practical APDs; namely P, the probability that an electron will ionize in each stage of a device, and Q, the probability that a hole will ionize in each stage of the device.

The excess noise factor of an APD, the standard measure of avalanche noise, can be expressed as:

$$F_e = <N_m^2>/<N_m>^2 \qquad (4)$$

where $N_m$ is the gain random variable for a single event at the input to an m-unit device, i.e. the total number of carriers generated at the output of the m-unit device which result from a single primary event at the input; $<N_m^2>$ is the second moment of the gain random variable; and $<N_m>^2$ is the square of the mean gain. The excess noise factor can be expressed in terms of the mean and the variance of $N_m$ as:

$$F_e = 1 + [\text{Var}(N_m)/<N_m>^2]. \qquad (5)$$

The overall internal noise of the device depends upon the shot noise arising from the randomness in the arrival rate and the multiplication and photogeneration noise arising from randomness in the carrier generation process. If the photogeneration process is strictly Poisson, the total internal noise of the device is given by:

$$\text{Var}(I) = 2qB<I>M^2 F_e \qquad (6)$$

where M is the mean multiplication rate, $<I>$ is the mean collected current, and B is the bandwidth. Clearly, the lowest noise figure is obtained when the excess noise factor, $F_e$, is one. If there is no spatial fluctuation in the physical multiplication mechanism, then the variance of $N_m$, $\text{Var}(N_m)$, will be zero and $F_e = 1$—the minimum noise factor possible—and the internal noise of the device is a minimum.

In general, the excess noise factor in an APD fabricated in accordance with the present invention can be expressed as:

$$F_e = 1 + [(1-1/M)(1-k_s)/(2+P(1+k_s))] *$$
$$[-P+2(1-k_s P^2)/(1+k_s P)[Mk_s(1+P)/(1-k_s)+ 1/(1+P)]] \qquad (7)$$

and M, the gain, can be expressed as:

$$M = (1+P)^m (1-k_s)/[(1+k_s P)^{m+1} - k_s(1+P)^{m+1}] \qquad (8)$$

where P is the probability that an electron will ionize in each stage, Q is the probability that a hole will ionize in each stage, $k_s$ is the ratio of Q to P, and m is the number of units within the device.

When the hole ionization rate vanishes, i.e. Q=0, then:

$$F_e = 1 + [1-(1+P)^{-m}](1-P)/(1+P) \qquad (9)$$

$$M = (1+P)^m \qquad (10)$$

Thus, when P>0, $F_e$ is always less than 2.

An examination of eqn (8) shows that the gain will diverge at some value of m unless Q=0. An infinite multiplication rate is known as avalanche breakdown and should be avoided for stable device performance. Physically, avalanche breakdown implies that each injected carrier generates a secondary electron hole pair on average. However, no avalanche breakdown occurs for the case when Q=0. In fact, for Q=0, in addition to avoiding avalanche breakdown, the excess noise factor always lies between 1 and 2 for all values of P and m and it approaches 1 at large values of P. In principle then, when Q=0, any gain can be achieved without more than a factor of two increase in noise from the ideal case, depending of course on the number of stages in the device and within practical limitations on device size and speed.

Thus, the maximum gain a device exhibits is limited by avalanche breakdown when Q is not zero. Further, as the number of units increases to increase the gain of the device, the excess noise factor increases dramatically. However, as Q decreases, larger values of P are possible at fixed m before avalanche breakdown occurs and the excess noise factor also strongly decreases.

Therefore, an optimal device structure would be one in which Q=0 and P is as close to 1 as possible. More importantly, a small value of P coupled with Q=0 is preferrable to a large value of P with a nonzero Q. Even for vanishingly small values of P, the noise factor penalty is never more than a factor of two when Q=0. The above-discussed criteria are used herein to optimize the doped quantum well design.

In accordance with the results of the Model, P increases dramatically as the built-in field within p+-n+ layers 10 and 12 increases, at fixed applied field throughout. In addition, the average distance the electrons travel from the heterointerface between layers 12 and 13 before impact ionizing decreases. The increase in P is due to the increase in the number of lucky-drift electrons within GaAs layer 13. The electrons are "superheated" by the electric field in p+-n+ layers 10 and 12 such that their distribution is greatly shifted in energy. Immediately thereafter, the electrons are injected into GaAs well layer 13. Upon crossing the heterointerface, the electrons overshoot their steady state energy, i.e. they gain more energy from the field than is lost to phonons, and they are accelerated semiballistically to energies at or above the ionization threshold energy. In this way, the electron ionization rate within GaAs layer 13 is greatly increased from its bulk value. However, as P increases through the action of the built-in field, so does the hole ionization rate. Consequently, a tradeoff exists between the hole ionization rate and P, i.e. the favorable increase in P is offset by the unfavorable increase in "b". This shows that a preferred device design exists, i.e. one which maximizes P and minimizes "b".

In accordance with the results of the Model, P has a maximum at a certain layer width for layers 10 and 12. This can be understood on a physical basis as follows. The "superheating" of the electron distribution depends upon the width of the p+-n+ layers 10 and 12. When the width of p+-n+ layers 10 and 12 is small, the net energy gain from the electric field per electron is not large. As a result, most electrons do not impact ionize upon being injected into adjacent GaAs layer 13. As the width of layer 11 increases, however, more electrons become hot enough so that upon being injected into GaAs layer 13, they impact ionize. However, if the width of p+-n+ layers 10 and 12 becomes too large, the electron impact ionization will occur within high electric field AlGaAs layer 10. Then the number of electrons which impact ionize within GaAs well layer 13 decreases, resulting in a lower value of P.

In accordance with the results of the Model, holes are heated in high field layer 11, along with electrons. As a result, there is a substantial increase in the hole impact ionization rate as the width of layer 11 increases. In addition, most hole impact ionization events occur within GaAs layer 13. This is so even though the holes are not immediately injected into GaAs layer 13 from the high field region of layers 10 and 12. Even though holes have to pass through the cooling region of low field AlGaAs layer 14, the cooling within layer 14 is insufficient to totally reduce the hole ionization rate. Moreover, an increase in the width of high field layers 10 and 12, also results in hole ionization within AlGaAs layers 10 and 12.

In accordance with the results of the Model, P is small for small widths of GaAs well layer 13. The electron ionization rate is also less in very narrow width GaAs layer 13 devices. Further, as discussed above, the effect of spatial quantization acts to reduce the electron ionization rate through the increase in the ionization threshold energy and the decrease in the effective heterointerface barrier height. Consequently, the peak values of both P and "a" occur when the width of GaAs well layer 13 is sufficiently large that quantization effects are less important, i.e. approximately 200 angstroms. As the width of GaAs layer 13 increases further, P and "a" both decrease since the electrons are cooled more effectively by drifting within a now larger total low electric field region.

In accordance with the results of the Model, the electron and hole ionization rates decrease as the width of the low field region increases, either through increasing the width of GaAs well layer 13 or low field $Al_{0.45}Ga_{0.55}As$ layer 14. The low field region of layers 13-14 cool both the electron and hole distributions. Also, the hole ionization rate decreases more with increasing width of the low field region than does the electron ionization rate. The hole-energy relaxation rate is much larger than the electron relaxation rate. Consequently, the holes relax faster to the corresponding low field steady state distribution.

In summary, several trade-offs exist in preferred embodiments of the doped quantum well APD of the present invention. It is desirable to highly dope the p+-n+ layers 10 and 12 to produce an extremely large electric field. However, there is a value of the electric field beyond which the hole impact ionization becomes large. Likewise, there exists an optimal length for the high field intrinsic layer 11 such that hole ionization does not occur, yet significant electron heating does, resulting in a substantial increase in P. Spatial quantization effects should be avoided in GaAs well layer 13. However, as the widths of GaAs layer 13 and low field AlGaAs layer 14 increase, the electron impact ionization rate decreases, owing to the cooling effects within the low field region of layers 13-14.

In accordance with the results of the Model, as the electric field increases, P increases dramatically and "a" and "b" increase simultaneously with the increase in P. Further, a large value of P, approaching fully deterministic electron ionization, is inconsistent with a simultaneously negligible hole ionization rate in the GaAs/AlGaAs material system. Because the conduction band edge discontinuity at the GaAs/AlGaAs heterointerface is not a large fraction of the band gap energy, the electrons are not sufficiently heated upon being injected into GaAs well layer 13 to cause impact ionization to occur. Attempts to further heat electrons through use of high field p+-n+ layers 10 and 12, result in substantial increase in "b" as well. It is expected that a material system where the energy difference in the conduction band discontinuity is a greater fraction of the band gap energy in the narrow band gap layer, e.g. layer 13, will provide a better medium for an ideal, photomultiplier-like device. An example of such a material system is $Al_xIn_{1-x}As/Ga_yIn_{1-y}As$.

The above-described analysis, comprising the Monte Carlo ensemble model of the Boltzmann transport equation which includes the full details of the band structure of the two materials in the superlattice unit and the physical scattering mechanisms under the constraints that Q, the probability that a secondary carrier impact ionizes at the output of each unit, be as close to 0 as possible, that the gain of the APD formed from the units be below avalanche breakdown, and secondarily that P, the probability that an incident carrier impact ionizes at the output of each unit, be as large as possible consistent with a small value of Q is referred to hereinafter as the "Brennan Analysis." Thus, the preferred APD design corresponds to the largest gain at the lowest excess noise. The Model results show that it is virtually impossible to obtain a high value of P at zero hole ionization. In order to achieve a high gain, large electron ionization rate, it is unavoidable that some residual hole ionization occurs in the present structure. A nonzero hole ionization rate has the dual disadvantage of causing an increase in the excess noise factor as well as limiting the usable gain by the advent of avalanche breakdown. A tradeoff then exists between a low noise but also low gain device, Q is zero but P is small, versus a high gain but noisier device, Q is nonzero but P is large. In the latter case, the maximum number of stages and hence the gain is fixed by the avalanche breakdown condition. For the case when Q is zero, avalanche breakdown does not occur so the gain is only limited by the number of stages which is in turn limited by the frequency response of the structure.

As a result of the above-described "Brennan Analysis" of the inventive doped quantum well superlattice APD the following have been determined to be a preferred set of parameters for the embodiment shown in FIG. 1:

1. doping of p+ layer 10 and n+ layer 12
   the doping level is above $2.0 \times 10^{18}$ cm$^{-3}$
2. width of layers in the high field p+-n+ region of layers 10 and 12
   the widths of p+ layer 10 and n+ layer 12 should be as small as possible consistent with enclosing an adequate amount of charge and should both be in the approximate range between 90 and 300 angstroms
3. width of GaAs well layer 13
   the width lies in the approximate range between 180 and 300 angstroms. Too small widths result in quantum mechanical spatial quantization effects which are deleterious to device performance by causing two effects, both of which effects act to reduce "a" and P:
   (a) as the layer width decreases, spatial quantization levels lie at higher energies. Consequently, the effective barrier height decreases and the impact ionization threshold energy increases.
   (b) too large a layer width acts to reduce "a" because fewer ionizations occur per unit length
4. width of low field AlGaAs layer 14
   the width lies in the approximate range between 200 and 500 angstroms. It is important to have a sufficiently long region so that holes can cool after crossing from the p+-n+ layers 10 and 12 before entering GaAs layer 13. However, if layer 14 is too long, as described above, "a" will be reduced.
5. applied electric field
   the applied electric field lies in the approximate range between 100 and 200 kV/cm.
6. percentage of Al in the $Al_xGa_{1-x}As$ composition
   the percentage lies in the approximate range between 0.40 to 0.45 which is at approximately the transition between the direct/indirect band energy transition. This range will provide the largest difference between the conduction band edges of the GaAs and the AlGaAs.

Figure 4:
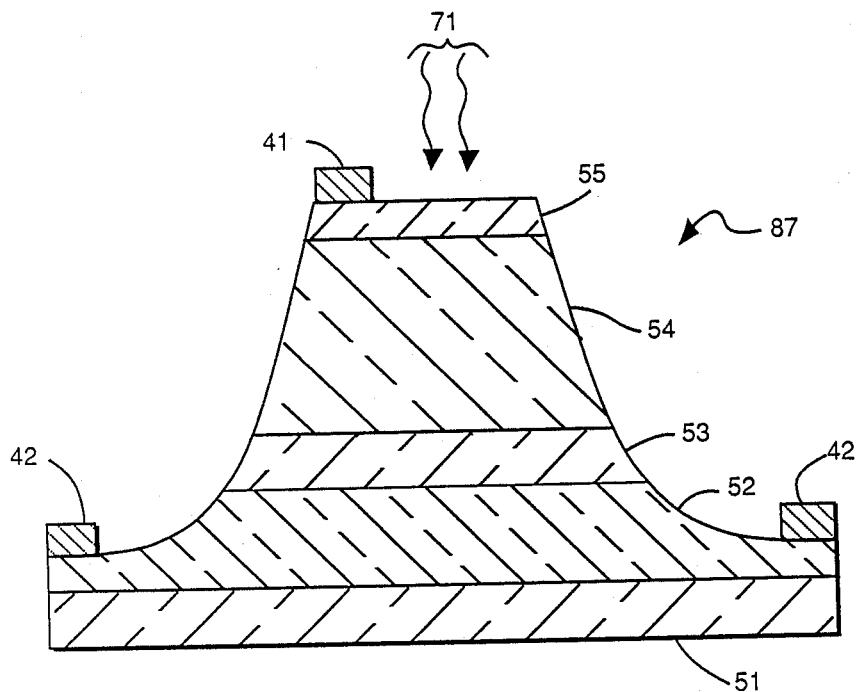
FIGS. 4 and 5 show, in pictorial form, two APDs fabricated in accordance with the present invention.
Figure 5:
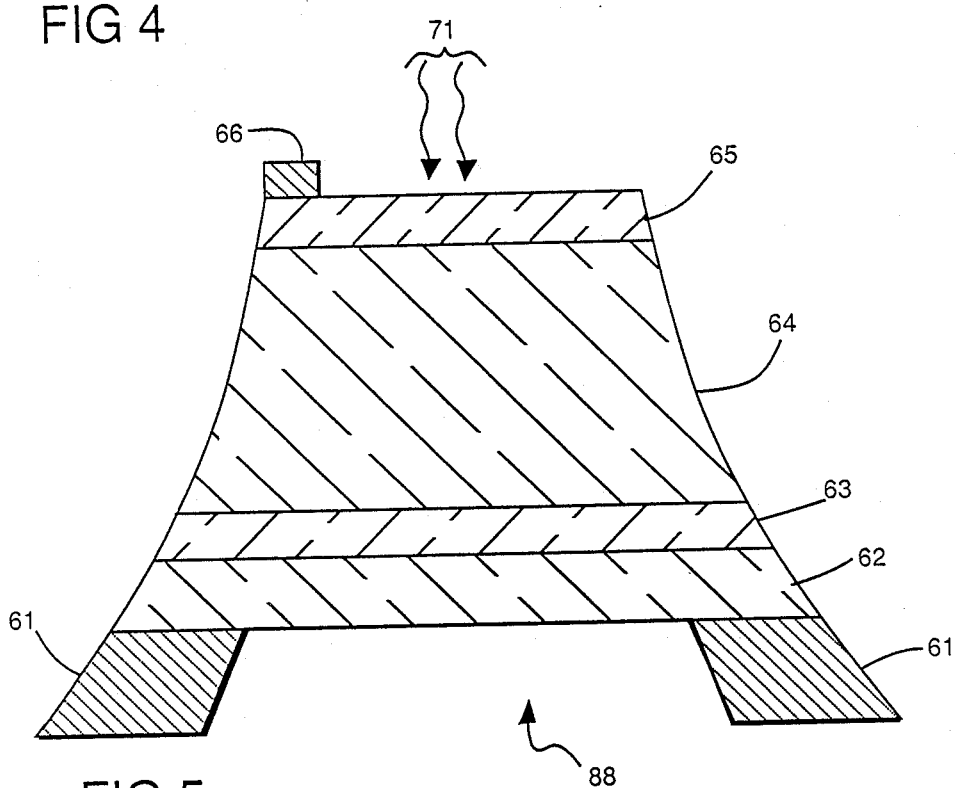

FIGS. 4 and 5 each show, in cross-sectional view, APD 87 and APD 88, respectively, fabricated in accordance with the present invention.

FIG. 4 shows APD 87 fabricated upon GaAs semi-insulating substrate 51, for example a Cr-doped (001) oriented semi-insulating GaAs substrate. Illustratively, APD 87 has a mesa geometry. n+ GaAs layer 52 is epitaxially grown upon substrate 51 by liquid phase epitaxy (LPE) or by molecular beam epitaxy (MBE); typically n+ layer 52 is doped with Si. Layer 52 is etched to permit the deposition of metal electrode 42 thereon and is highly doped to enable a low resistance connection to metal electrode 42 and a low voltage drop between the electrode and superlattice 54. Metal electrode 42 may comprise an Au-Ge alloy which is sintered onto layer 52. n-type GaAs layer 53 is epitaxially grown on layer 52. The widths of GaAs layers 52 and 53 depend only on the frequency response desired for the device. Otherwise, the widths can be taken to be whatever is necessary for proper doping, metallization and mechanical stress support.

Superlattice 54 is epitaxially grown by MBE on layer 53. Superlattice 54 comprises a multiplicity of units of p+-n+ AlGaAs layers 10 and 12, intrinsic GaAs layer 13 and intrinsic AlGaAs layer 14 shown in FIG. 1. In the preferred embodiment, the widths of the layers in each unit of superlattice 54 are taken from the parameters set forth hereinabove. The number of units to be used in any particular device depend on the frequency response desired for the device—the higher the frequency response, the fewer the number of units—and the desired gain for the device.

p+ $Al_{0.45}Ga_{0.55}As$ layer 55 is epitaxially grown by MBE on superlattice 54; typically, p+ layer 55 is doped using magnesium, beryllium, or zinc. Metal contact 41 is deposited on layer 55 and has an aperture to permit incident radiation 71 to impinge upon layer 55. Layer 55 is heavily doped to enable a low resistance connection to be made to metal electrode 41. The Al concentration in AlGaAs layer 55 depends upon the wavelength of the radiation one desires to detect. The maximum photon energy detectable using the $GaAs/Al_xGa_{1-x}As$ material system is 1.99 eV, corresponding to x=0.45. The thickness of layer 55 depends upon the absorption coefficient of the material and the material quality, particularly the diffusion coefficient of electrons, and the surface state concentration. The higher the quality the material, the thicker the layer can be. Advantageously, the radiation should be absorbed within a diffusion length of the region where avalanche multiplication takes place; superlattice 54. In practice, the thickness of layer 55 should be approximately 0.1 to 0.5 um thick.

FIG. 5 shows another embodiment of the inventive APD. Here, APD 88 ±s fabricated upon n+ GaAs substrate layer 62. Metal electrode 61 is deposited directly upon layer 62. Hereinafter, layers 62–65 and electrode 66 are directly analogous to layers 53–55 and electrode 41 of FIG. 4.

Clearly, those skilled in the art recognize that further embodiments of the present invention may be made without departing from its teachings. For example, embodiments of the present invention may be fabricated in the AlInAs/GaInAs material system. There, advantage accrues from the fact that the bandgap energies are 1.5 eV/0.7 eV. This produces the desired enhancement in electron kinetic energy as the electron traverses the heterointerface, said enhancement being even greater than that which occurs with the GaAs/AlGaAs material system. In addition, the InGaAs/InP and InGaAsP/InP material systems are potentially useful for fabricating APDs where the majority carrier is a hole. However, devices where holes are the majority carrier are not expected to be as efficient as those where electrons are the majority carrier because the relaxation coefficient for holes is greater than that for electrons. Furthermore, the order of the layers in the superlattice unit for embodiments where electrons are the majority carriers may, for convenience of growing the layers or otherwise, be as follows: a nearly intrinsic layer of a first material having a large ionization threshold, a nearly intrinsic layer of a second material having a smaller ionization threshold, and n+-p+ layers of the first material. Still further, for embodiments where the majority carriers are holes, the order of the layers in the superlattice unit may be: n+-p+ layers of a first material having a large ionization threshold, a nearly intrinsic layer of a second material having a smaller ionization threshold, and a nearly intrinsic layer of the first material or the mirror image thereof.

What is claimed is:

1. In an avalanche photodetector device comprising:
   at least one unit which includes the following contiguous layers in sequence:

a p+ doped layer of a first material having a first ionization threshold, an n+ layer of the first material, a substantially intrinsic layer of a second material having a smaller ionization threshold than the first material, and a substantially intrinsic layer of the first material.

2. In the device of claim 1 wherein:

the doping level of the p+ layer and of the n+ layer is each greater than $2.0 \times 10^{18}$ cm$^{-3}$, the width of the p+ layer and of the n+ layer is each in the approximate range of 95 to 300 angstroms, the width of the substantially intrinsic layer of the second material is in the approximate range of 180 to 300 angstroms, the width of the substantially intrinsic layer of the first material is in the approximate range of 200 to 500 angstroms, and the first material is GaAs and the second material is an alloy of GaAs.

3. In the device of claim 2 wherein the alloy of AlGaAs is $Al_xGa_{1-x}As$, x being in the approximate range between 0.4 to 0.45.

4. A device in accordance with claim 3 which further comprises a highly p doped semiconductor layer, contiguous with the p+ layer of the first unit of said at least one unit, a highly n doped semiconductor layer contiguous with the substantially intrinsic layer of the first material of the last of the at least one unit, and electrodes ohmerically contacted to the highly doped p and n semiconductor layers.

5. The device of claim 4 which further comprises a source of voltage for reverse biasing the device electrodes to generate an electric field in the p+ layer and in the n+ layer having an average value in the approximate range of 100 to 200 kV/cm.

6. In an avalanche photodetector device comprising:

at least one unit which includes the following contiguous layers in sequence:

a substantially intrinsic layer of a first material having a first ionization potential, a substantially intrinsic layer of a second material having a smaller ionization threshold than the first material, an n+ layer of the first material, and a p+ doped layer of the first material.

7. In the device of claim 6 wherein:

the doping level of the p+ layer and of the n+ layer is each greater than $2.0 \times$ cm$^{-3}$, the width of the substantially intrinsic layer of the first material is in the approximate range of 200 to 500 angstroms, the width of the substantially intrinsic layer of the second material is in the approximate range of 180 to 300 angstroms, the width of the p+ layer and of the n+ layer is each in the approximate range of 95 to 300 angstroms, and the first material is AlGaAs and the second material is an alloy of GaAs.

8. In the device of claim 7 wherein the alloy of AlGaAs is $Al_xGa_{1-x}As$, x being in the approximate range between 0.4 to 0.45.

9. A device in accordance with claim 8 which further comprises a highly p doped semiconductor layer contiguous with the p+ layer of the first unit of said at least one unit, a highly n doped semiconductor layer contiguous with the substantially intrinsic layer of the first material of the last unit of said at least one unit, and electrodes ohmically contacted to the highly doped p and n semiconductor layers.

10. The device of claim 9 which further comprises a source of voltage for reverse biasing the electrodes to generate an electric field in the p+ layer and in the n+ layer having an average value in the approximate range of 100 to 200 kV/cm.

11. In the device of claim 1 wherein the first material is an alloy of AlInAs and the second material is an alloy of GaInAs.

12. In the device of claim 6 wherein the first material is an alloy of AlInAs and the second material is an alloy of GaInAs.

13. In the device of claim 1 wherein the first material is an alloy of InGaAs and the second material is InP.

14. In the device of claim 6 wherein the first material is an alloy of InGaAs and the second material is InP.

15. In the device of claim 1 wherein the first material is an alloy of InGaAsP and the second material is InP.

16. In the device of claim 6 wherein the first material is an alloy of InGaAs and the second material is InP.

17. In an avalanche photodetector device wherein the majority carriers are holes comprising:

at least one unit which includes the following contiguous layers in sequence:

a first substantially intrinsic layer of a first material having a first ionization potential, a substantially intrinsic layer of a second material having a smaller ionization threshold than the first material.

a p+ layer of the first material, and an n+ doped layer of a first material.

18. In the device of claim 17 wherein the first material is an alloy of InGaAs and the second material is InP.

19. In the device of claim 17 wherein the first material is an alloy of InGaAsP and the second material is InP.

* * * * *